(12) United States Patent
Mikhailov et al.

(10) Patent No.: US 8,749,888 B2
(45) Date of Patent: Jun. 10, 2014

(54) ARRANGEMENT FOR PRODUCING LASER RADIATION, AND LASER DEVICE COMPRISING SUCH AN ARRANGEMENT

(75) Inventors: Aleksei Mikhailov, Dortmund (DE); Yury Kolotushkin, St. Petersburg (RU)

(73) Assignee: LIMO Patentverwaltung GmbH & Co. KG, Dortmund (DE)

(*) Notice: Subject to any disclaimer, the term of this patent is extended or adjusted under 35 U.S.C. 154(b) by 198 days.

(21) Appl. No.: 13/320,337

(22) PCT Filed: May 12, 2010

(86) PCT No.: PCT/EP2010/002896
§ 371 (c)(1),
(2), (4) Date: Jan. 26, 2012

(87) PCT Pub. No.: WO2010/130415
PCT Pub. Date: Nov. 18, 2010

(65) Prior Publication Data
US 2012/0127723 A1    May 24, 2012

(30) Foreign Application Priority Data
May 14, 2009 (DE) .......................... 10 2009 021 251

(51) Int. Cl.
*G02B 27/10* (2006.01)
(52) U.S. Cl.
USPC ........................................................ 359/626
(58) Field of Classification Search
USPC .......... 359/621–624, 626, 639; 362/236, 237, 362/326, 331; 372/29.02, 29.021, 29.014
See application file for complete search history.

(56) References Cited

U.S. PATENT DOCUMENTS

| 5,469,423 A | 11/1995 | Shinoda et al. |
| 5,796,521 A | 8/1998 | Kahlert et al. |

(Continued)

FOREIGN PATENT DOCUMENTS

| EP | 1 574 892 A2 | 9/2005 |
| JP | 2002176007 A | 8/2000 |
| JP | 2003218017 A | 7/2003 |
| JP | 2004093837 A | 3/2004 |

(Continued)

OTHER PUBLICATIONS

German Patent and Trademark Office Search Report, Dated May 14, 2009.

*Primary Examiner* — Joseph P Martinez
(74) *Attorney, Agent, or Firm* — Laurence A. Greenberg; Werner H. Stemer; Ralph E. Locher

(57) ABSTRACT

A device for producing laser radiation includes a homogenizer device which can separately homogenize a plurality of groups of partial beams of laser radiation in such a way that each group of partial beams proceeding from the homogenizer device can produce a line-shaped intensity distribution in a work plane, with the distribution having flanks which drop steeply at the line ends. The device further includes a superposition device for superpositioning the groups of partial beams in such a way that a line-shaped or linear intensity distribution having a length longer than the length of each of the line-shaped intensity distributions of the groups of partial beams can be produced in a work plane, wherein the superposition device includes a lens array having a plurality of lenses.

16 Claims, 4 Drawing Sheets

(56) References Cited

U.S. PATENT DOCUMENTS

| | | |
|---|---|---|
| 6,967,777 B2 | 11/2005 | Hirai |
| 7,816,632 B2 | 10/2010 | Otsu et al. |
| 7,970,029 B2 | 6/2011 | Teramura |
| 2005/0248849 A1 | 11/2005 | Urey et al. |
| 2006/0209310 A1* | 9/2006 | Muenz et al. ............ 356/521 |
| 2007/0063226 A1 | 3/2007 | Tanaka et al. |
| 2007/0268794 A1 | 11/2007 | Hill et al. |
| 2008/0273123 A1 | 11/2008 | Morikawa et al. |
| 2011/0051253 A1 | 3/2011 | Mitra et al. |

FOREIGN PATENT DOCUMENTS

| | | |
|---|---|---|
| JP | 2008526511 A | 7/2008 |
| WO | 03076150 A1 | 9/2003 |
| WO | 2007/043597 A1 | 4/2007 |
| WO | 2007/122061 A1 | 11/2007 |
| WO | 2008/006460 A1 | 1/2008 |
| WO | 2008/087012 A1 | 7/2008 |

* cited by examiner

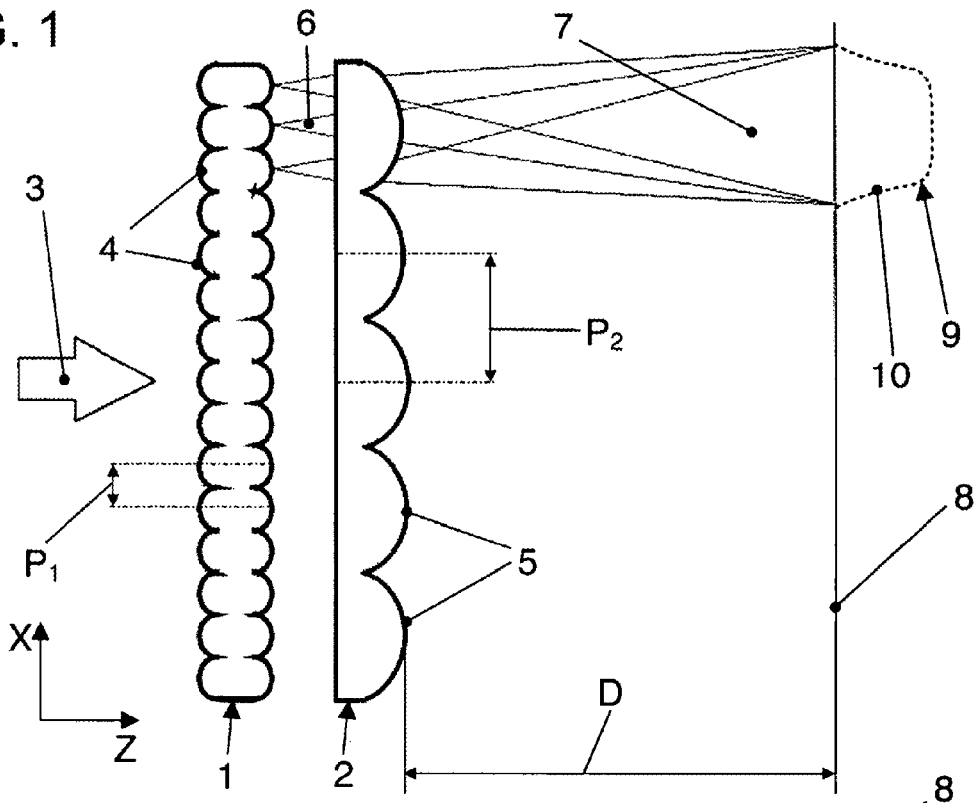
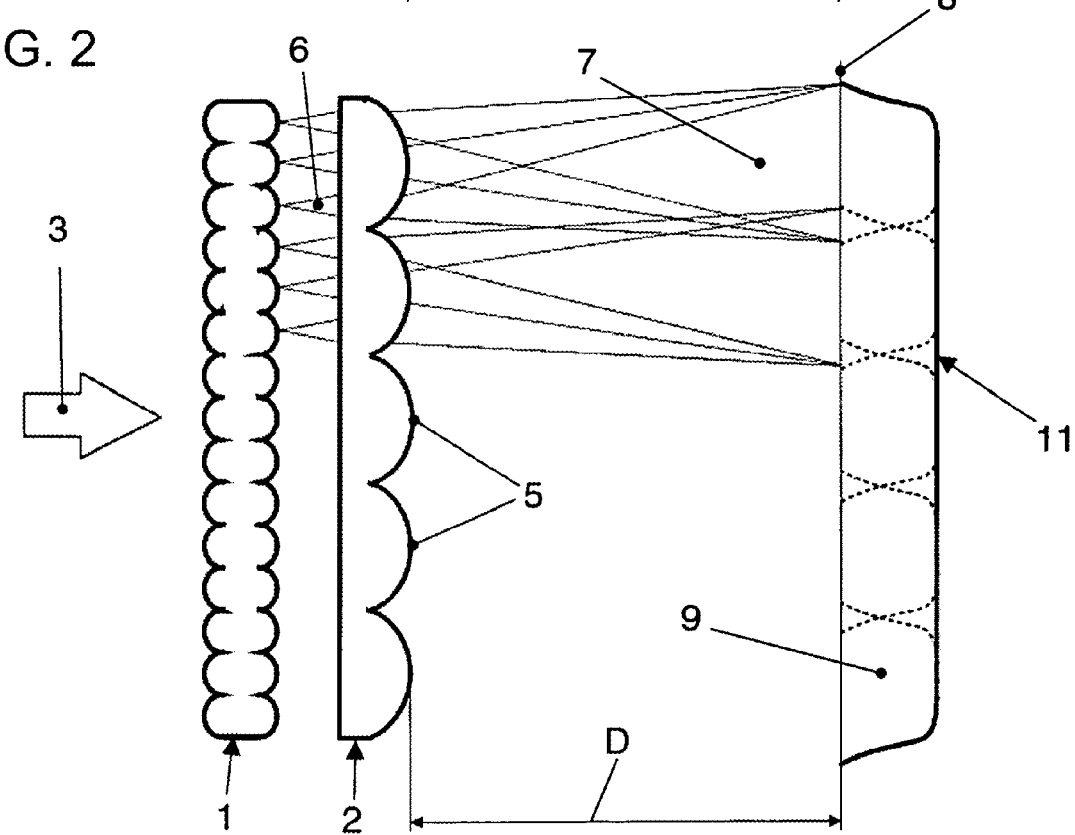

ARRANGEMENT FOR PRODUCING LASER RADIATION, AND LASER DEVICE COMPRISING SUCH AN ARRANGEMENT

BACKGROUND OF THE INVENTION

Field of the Invention

The present invention relates to a device for producing laser radiation including homogenizing means, which can separately homogenize a plurality of partial beams or a plurality of groups of partial beams of the laser radiation such that the partial beams or groups of partial beams emanating from the homogenizing means can each generate a line-shaped intensity distribution, with steeply decreasing flanks at the line ends, in a work plane, and superposition means for superposing the partial beams or groups of partial beams such that a line-shaped intensity distribution can be generated in the work plane, the length of which intensity distribution is greater than the length of each line-shaped intensity distribution of the partial beams or groups of partial beams. The invention also relates to a device for producing laser radiation including homogenizing means, which can separately homogenize a plurality of partial beams or a plurality of groups of partial beams of the laser radiation such that the partial beams or groups of partial beams emanating from the homogenizing means can each generate a line-shaped intensity distribution, with steeply decreasing flanks at the line ends, in a work plane, and superposition means for superposing the partial beams or groups of partial beams such that a line-shaped intensity distribution can be generated in the work plane, the length of which intensity distribution is greater than the length of each line-shaped intensity distribution of the partial beams or groups of partial beams. The invention additionally relates to a laser device including at least one laser light source and a device according to the invention for producing laser radiation.

DEFINITIONS

In the propagation direction of the laser radiation means the mean propagation direction of the laser radiation, particularly if this is not a planar wave or is at least partly divergent. Unless explicitly stated otherwise, laser beam, light beam, partial beam or beam does not mean an idealized beam from geometric optics, but a real light beam, such as e.g. a laser beam with a Gaussian profile or a modified Gaussian profile or a top-hat profile, that does not have an infinitesimally small beam cross section, but rather a finite beam cross section. A top-hat distribution or a top-hat intensity distribution or a top-hat profile means an intensity distribution, which can substantially be described by a rectangle function (rect(x)), at least in respect of one direction. Here, it should also be possible to denote real intensity distributions, which have deviations from a rectangle function of the order of percent or which have angled flanks, as top-hat distributions or top-hat profiles.

A device of the type mentioned at the outset for producing laser radiation and a laser device of the type mentioned at the outset have been disclosed in WO 2008/006460 A1. In the device described therein, a lens array is provided as homogenizer means, the lenses of which have different widths. In particular, the width of the lenses reduces from the edge toward the center. This achieves a top-hat angular distribution with trapezoidal-like decreasing flanks of the laser radiation that passed through the homogenizer means. A plurality of laser modules with such homogenizer means can be arranged next to one another such that the laser radiations thereof overlap in a work plane to form a homogeneous line-shaped intensity distribution.

The fact that a top-hat angular distribution with trapezoidal-like decreasing flanks is required was found to be disadvantageous in this prior art. In order to achieve said distribution, the homogenizer means must have a complex design as the pitch of the lenses decreases from the outside to the inside.

BRIEF SUMMARY OF THE INVENTION

The problem on which the present invention is based is the development of a device of the type mentioned at the outset for producing laser radiation and a laser device of the type mentioned at the outset that have a simpler and/or more cost-effective design, particularly in respect of the design of the homogenizer means.

According to the invention, this is achieved by a device of the type mentioned at the outset for producing laser radiation with the characterizing features of a first aspect of the invention and/or by a device of the type mentioned at the outset for producing laser radiation with the features of a second aspect of the invention, and by a laser device of the type mentioned at the outset with the features of the invention. The dependent claims relate to preferred embodiments of the invention.

As per the first aspect of the invention, provision is made for the superposition means to comprise a lens array with a plurality of lenses. As per the second aspect of the invention, provision is made for the device furthermore to comprise control means, which can influence the laser radiation such that the magnitude of the intensity of all of the partial beams emanating from the homogenizing means or of all of the groups of partial beams emanating from the homogenizing means is the same. Both measures can serve to ensure homogeneous superposition of the individual partial beams or groups of partial beams in the work plane, without the flanks of the angular distributions having to decrease in a trapezoidal-like fashion or without the homogenizer means needing changing pitches of the lenses. In the present invention it is sufficient for the flanks to drop and the angular distributions to be symmetrical.

In principle, the present invention allows the generation of arbitrary long line-shaped intensity distributions. Furthermore, the quality of homogeneity is only adversely affected by the production tolerances when producing the lens arrays for the homogenizer means and/or the superposition means. Good homogeneity can be achieved without complicated adjustment.

Provision can be made for the following condition to hold true for the lenses in the lens array:

$$2 \cdot F \cdot NA(50\%) = M \cdot P_2$$

with M=1, 2, 3, . . . ,
wherein F is the focal length of each lens,
wherein $P_2$ is the pitch of the lenses,
and wherein NA(50%) is the numerical aperture of each lens, defined by that angle at which the intensity of the light passing through the lenses has fallen by half. Very homogeneous intensity distributions can be achieved by satisfying this condition and at the same time providing feedback by the control means as per the second aspect of the invention.

Alternatively, provision can be made for the following condition to hold true for the laser radiation and for the lenses in the lens array:

$$\frac{w_0}{d} > 1.1$$

wherein $w_0$ is the distance in the work plane between the maximum intensity and the intensity that has dropped to $1/e^2$ in the intensity distribution generated by one of the lenses, and wherein d is the distance in the work plane between the maximum intensities of the intensity distributions generated by two adjacent lenses. This embodiment is advantageous in that, firstly, even Gaussian-like angular distributions of the partial beams or groups of partial beams can be superposed such that homogeneous lines are generated. Secondly, the requirement that $w_0/d>1.1$ need not be adhered to as strictly as the requirement that $2 \cdot F \cdot NA(50\%) = M \cdot P_2$, and so the design of such a device can be simpler.

BRIEF DESCRIPTION OF THE SEVERAL VIEWS OF THE DRAWING

Further features and advantages of the present invention are elucidated on the basis of the following description of preferred exemplary embodiments with reference to the attached figures, in which:

FIG. 1 shows a schematic plan view of a first embodiment of a device according to the invention for producing laser radiation, wherein the intensity distribution of a group of partial beams in the work plane has been elucidated;

FIG. 2 shows a schematic plan view of the first embodiment, wherein the overall intensity distribution of all groups of partial beams in the work plane has been elucidated;

DESCRIPTION OF THE INVENTION

Figure 3:
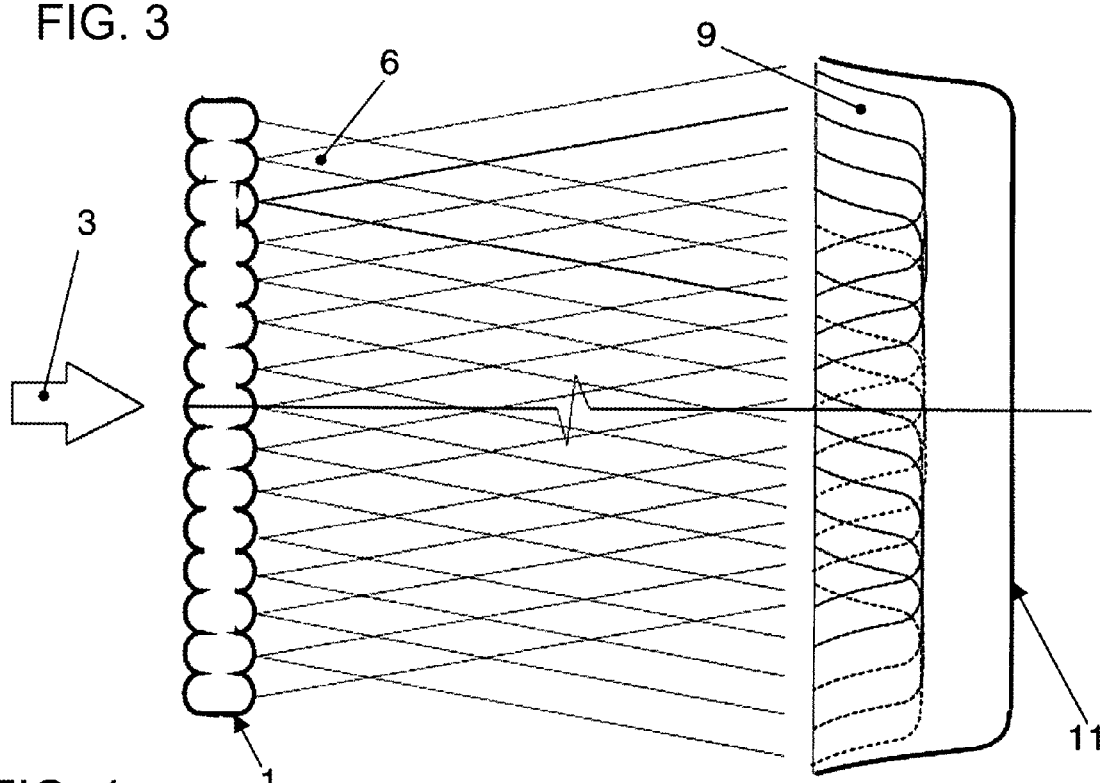
FIG. 3 shows a schematic plan view of a second embodiment of a device according to the invention for producing laser radiation, wherein the overall intensity distribution of all groups of partial beams in the work plane has been elucidated.

In the figures, equivalent or functionally equivalent parts or light beams or intensity distributions or dimensions have been provided with the same reference sign. Furthermore, a Cartesian coordinate system has been drawn in some of the figures for a better overview.

The embodiment of a device according to the invention illustrated in FIG. 1 and FIG. 2 comprises homogenizer means 1 and superposition means 2. Here, the superposition means 2 are arranged downstream of the homogenizer means 1 in the propagation direction Z of the laser radiation 3 to be produced.

The homogenizer means 1 are embodied as an integral lens array and comprise a plurality of lenses 4 arranged next to one another in the X-direction. These lenses can be cylindrical lenses with cylinder axes extending in the Y-direction, or else they can be spherical lenses.

The superposition means 2 are likewise embodied as an integral lens array and likewise comprise a plurality of lenses 5 arranged next to one another in the X-direction. These lenses can also be cylindrical lenses with cylinder axes extending in the Y-direction, or else they can be spherical lenses. Each lens 5 can have the same focal length F.

In the illustrated exemplary embodiment, the superposition means 2 have five lenses 5. It is by all means possible to provide a greater, in particular much greater, number of lenses 5, with the number of lenses 4 in the homogenizer means 1 then also being correspondingly greater.

In the illustrated exemplary embodiment, the width of the lenses 5 in the superposition means 2 is greater than the width of the lenses 4 in the homogenizer means 1 by a factor of three, and so each lens 5 in the superposition means 2 is associated with three lenses 4 in the homogenizer means 1. Accordingly, the following relation holds true for the pitch $P_1$ of the lenses 4 and the pitch $P_2$ of the lenses 5: $3 \cdot P_1 = P_2$ (see FIG. 1).

It is by all means possible to provide smaller or larger lenses 4 in the homogenizer means 1. In particular, it is possible to associate a greater number of lenses 4 in the homogenizer means 1 with each lens 5 in the superposition means 2.

In the illustrated exemplary embodiment, the laser radiation 3 to be produced should have a line-shaped intensity distribution when impinging on the homogenizer means 1, with the line length of this line-shaped intensity distribution in the X-direction approximately corresponding to the length of the homogenizer means 1 in the X-direction.

The laser radiation 3 is split into a plurality of partial beams 6 by the lenses 4 in the homogenizer means 1. Respectively one group 7 of three partial beams 6 together pass through one of the lenses 5 in the superposition means 2. The three partial beams 6 of each group 7 are superposed to form a line-shaped intensity distribution 9 (see FIG. 1) in a work plane 8, which is arranged at a distance D, corresponding to the focal length F of the lenses 5, from the lenses 5 in the superposition means 2.

The intensity distribution 9 substantially has the shape of a top-hat distribution; however, it does not have flanks 10 with infinitely steep gradients but rather it has comparative moderately decreasing flanks 10 (see FIG. 1). The shape of the intensity distribution 9 is prescribed by the design of the homogenizer means 1, more particularly by the design of each individual lens 4 in the homogenizer means 1.

FIG. 2 elucidates that the homogenizer means 1 and the superposition means 2 are designed and arranged such that the intensity distributions 9 of the individual groups 8 of partial beams 7 in the work plane 8 in each case overlap at 50% of the maximum intensity of the individual intensity distributions 9. This results in a very homogeneous overall intensity distribution 11.

The condition for the largely oscillation-free transition between the individual intensity distributions 9 to form an overall intensity distribution 11 can be written as $$2 \cdot F \cdot NA(50\%) = P_2.$$

Here, $NA(50\%)$ is the numerical aperture of each lens 5, defined by that angle at which the intensity of the light passing through the lenses 5 has fallen by half.

An additional condition is that the intensities of the individual groups 7 of partial beams 6 have the same magnitude in the work plane 8. This can be achieved by an arrangement as illustrated in the laser device as per FIG. 8 and FIG. 9.

In this laser device, a plurality of beam splitters 12 are provided between the homogenizer means 1 and the superposition means 2, with the number of beam splitters 12 corresponding to the number of lenses 5 in the superposition means 2. The beam splitters 12 in each case deflect a small proportion 13 of the light of a group 7 of partial beams 6 upward in FIG. 9 or in the Y-direction from the propagation direction Z.

These proportions 13 of the laser radiation 3 impinge on a plurality of sensor means 14, which can each detect the intensity of one of the groups 7 of partial beams 6. The laser device furthermore comprises comparison means 15, which are able to compare the intensities of the individual groups 7 of partial beams 6 detected by the sensor means 14 with one another. The comparison means 15 can actuate a power supply 16 of one or more laser light sources 17 (indicated schematically in FIG. 9) such that the intensities of the groups 7 of partial beams 6 are matched to one another.

This allows laser radiation with the same power to pass through each lens 5 in the superposition means 2. This leads to the very homogeneous line-shaped overall intensity distribution 11, as illustrated in FIG. 2.

Figure 8:
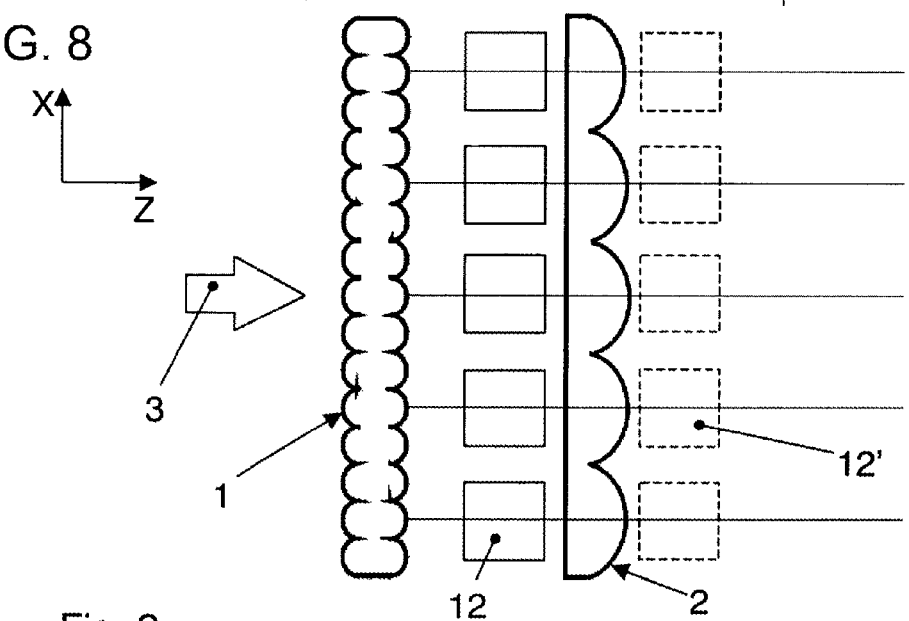
FIG. 8 shows a schematic detailed plan view of a laser device according to the invention with a fifth embodiment of a device according to the invention for producing laser radiation.
Figure 9:
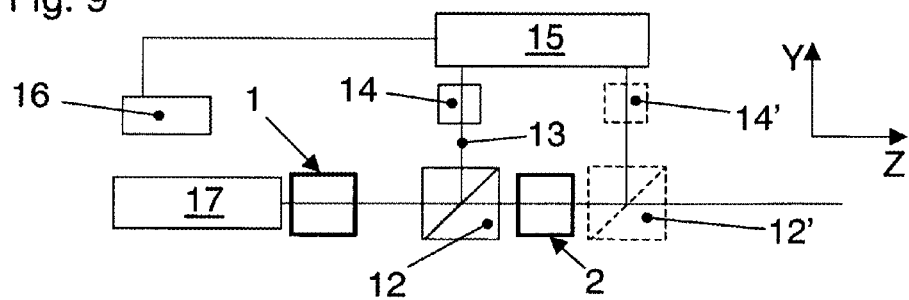
FIG. 9 shows a schematic detailed lateral view of the laser device as per FIG. 8.

FIGS. 8 and 9 indicate, with a dashed line, beam splitter 12' and sensor means 14', which can be provided downstream of the superposition means 2 as an alternative to the beam splitters 12 and sensor means 14 illustrated by a full line.

The sensor means 14 can be embodied as photodiode, photoresistor, phototransistor, photocell or the like.

The aforementioned beam splitters 12, 12', sensor means 14, 14' and comparison means 15 overall form control means that ensure the same power or intensities across the groups 7 of partial beams 6 in the work plane 8. These control means may likewise be provided in all embodiments illustrated in FIGS. 2 to 7.

In the embodiments as per FIG. 1 and FIG. 2, the lenses 4 in the homogenizer means 1 are embodied such that the directional diagram or angular distribution of the groups 7 of partial beams 6 has moderately decreasing flanks. The superposition at a distance D=F downstream of the lenses 5 then results in the intensity distributions 9 illustrated in FIG. 1 and FIG. 2.

However, according to the invention, it is also possible for the lenses 4 in the homogenizer means 1 to be embodied such that the directional diagram or angular distribution of the groups 7 of partial beams 6 has flanks decreasing with an almost infinitely steep gradient or comes very close to an ideal top-hat angular distribution. In this case, the work plane 8 is then not selected at a distance D=F downstream of the lenses 5, but at a distance D=F+δ. Here, the additional distance δ should be selected such that a superposed intensity distribution 9 of the individual groups 7 of partial beams 6 has less steeply decreasing flanks 10 in the work plane 9.

FIG. 3 shows an embodiment in which the superposition means 2 are dispensed with. The groups 7 of partial beams 6 then superpose in the far field, i.e. at a great distance from the homogenizer means 1.

Figure 4:
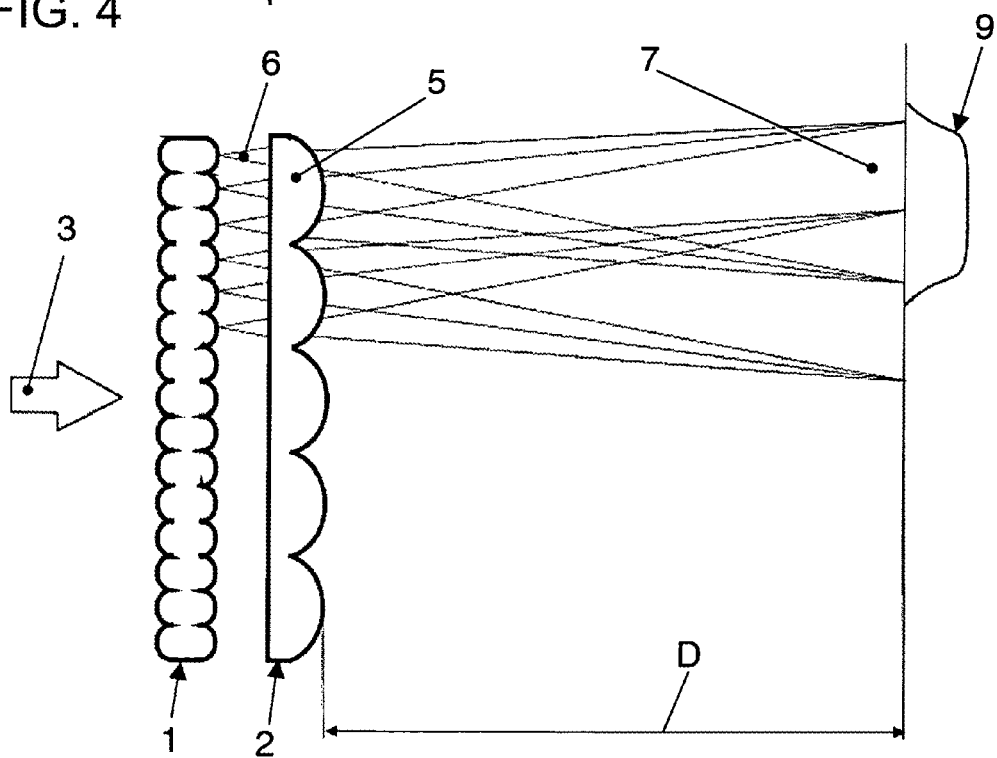
FIG. 4 shows a schematic plan view of a third embodiment of a device according to the invention for producing laser radiation, wherein the intensity distribution of a group of partial beams in the work plane has been elucidated.
Figure 5:
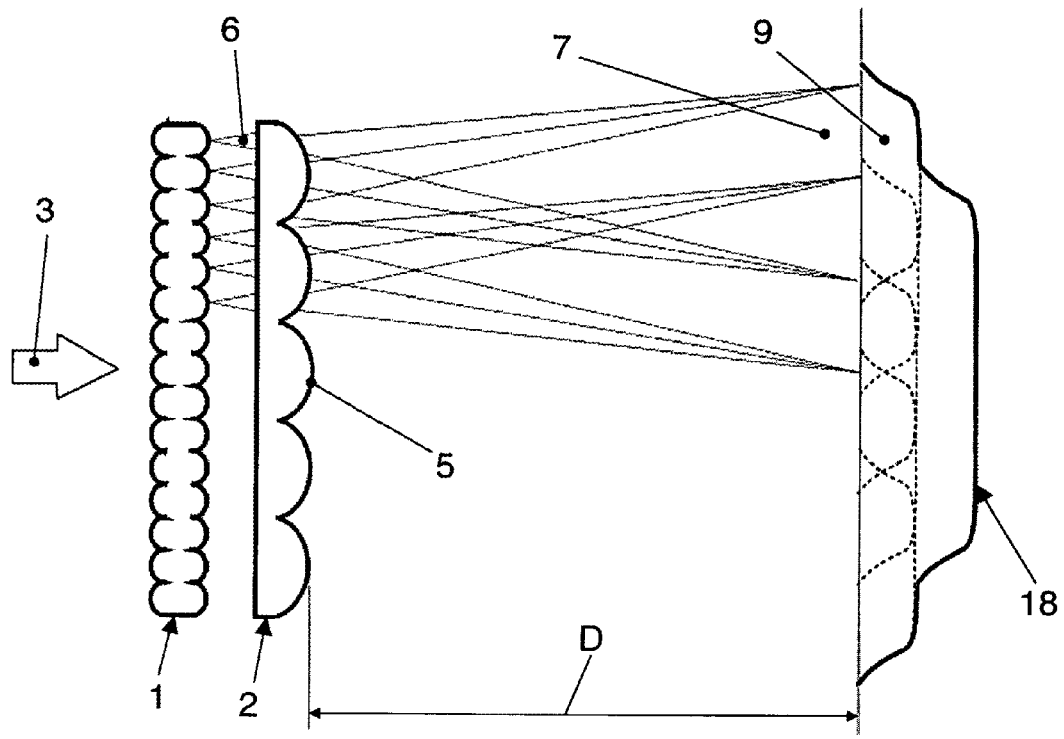
FIG. 5 shows a schematic plan view of the third embodiment, wherein the overall intensity distribution of all groups of partial beams in the work plane has been elucidated.

FIG. 4 and FIG. 5 show an embodiment in which the focal length F of the lenses 5 in the superposition means 2 is greater than in the embodiment as per FIGS. 1 and 2. The result of this is that the intensity distributions 9 of the individual groups 7 of partial beams 6 are wider in the work plane 8. If the condition $$2 \cdot F \cdot NA(50\%) = M \cdot P_2,$$

with M=1, 2, 3, . . . is satisfied, there nevertheless is an oscillation-free superposition of the intensity distributions 9 forming an overall intensity distribution 18 (see FIG. 5). FIG. 4 and FIG. 5 show the case in which M=2.

Figure 6:
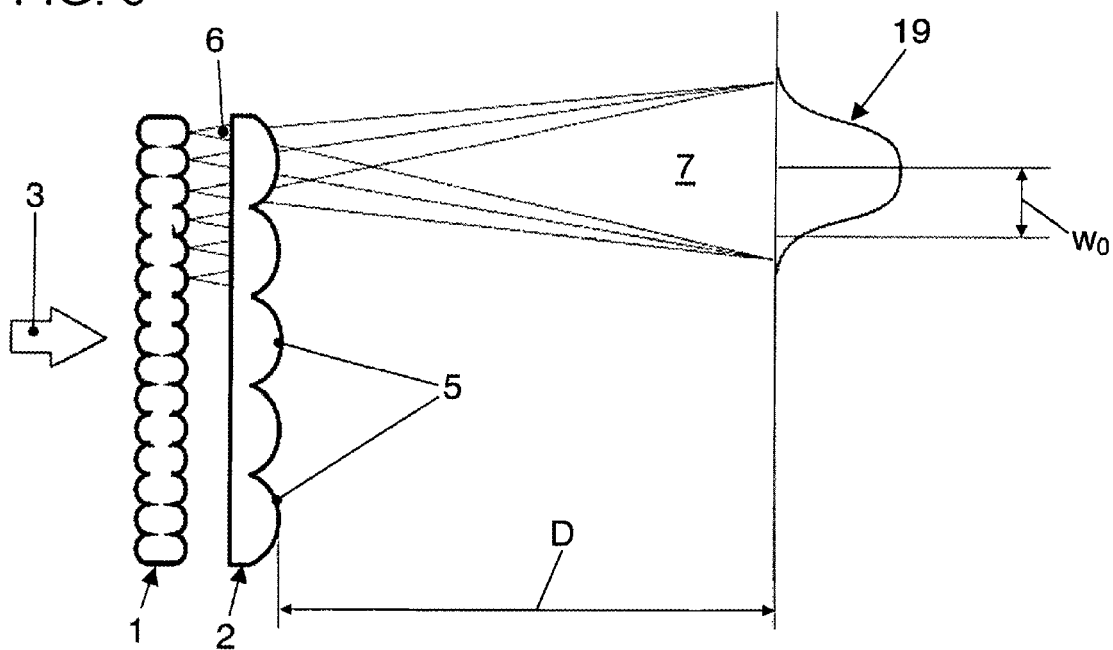
FIG. 6 shows a schematic plan view of a fourth embodiment of a device according to the invention for producing laser radiation, wherein the intensity distribution of a group of partial beams in the work plane has been elucidated.
Figure 7:
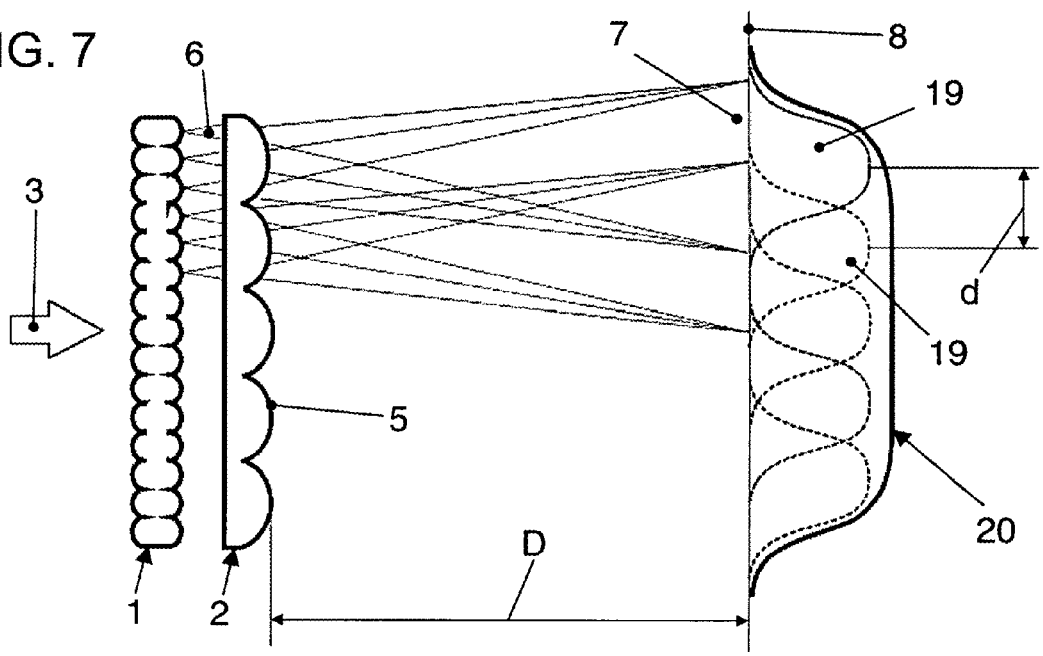
FIG. 7 shows a schematic plan view of the fourth embodiment, wherein the overall intensity distribution of all groups of partial beams in the work plane has been elucidated.

In the embodiment as per FIG. 6 and FIG. 7, the lenses 4 in the homogenizer means 1 are embodied such that although the directional diagram or the angular distribution of the groups 7 of partial beams 6 has moderately decreasing flanks, it does not have angular regions with constant intensity. The superposition at a distance D=F downstream of the lenses 5 then results in the intensity distributions 19, shown in FIG. 6 and FIG. 7, without a pronounced plateau region, which are similar to a Gaussian distribution.

The condition for the superposition forming an overall intensity distribution 20 with inhomogeneities of less than 1% is:

$$\frac{w_0}{d} > 1.1.$$

Here $w_0$ is the distance in the work plane 8 between the maximum intensity and the intensity that has dropped to $1/e^2$ in the intensity distribution 19 generated by one of the lenses 5 and d is the distance in the work plane 8 between the maximum intensities of the intensity distributions 19 generated by two adjacent lenses 5.

The invention claimed is:

1. A device for producing laser radiation, the device comprising:
    a homogenizing device configured to separately homogenize a plurality of partial beams or a plurality of groups of partial beams of the laser radiation and to cause the partial beams or groups of partial beams emanating from said homogenizing device to each generate a line-shaped intensity distribution with steeply decreasing flanks at line ends, in a work plane; and
    a superposition device configured to superpose the partial beams or groups of partial beams, to permit the line-shaped intensity distribution to be generated in the work plane and to cause the intensity distribution to have a length greater than a length of each line-shaped intensity distribution of the partial beams or groups of partial beams;
    said superposition device including a lens array with a plurality of lenses and the following condition holds true for said lenses in said lens array:

$$2 \cdot F \cdot NA(50\%) = M \cdot P_2 \text{ with } M = 1, 2, 3, \ldots,$$

F is the focal length of each lens,
    $P_2$ is the pitch of said lenses, and
    NA(50%) is the numerical aperture of each lens, defined by an angle at which the intensity of light passing through said lenses has fallen by half.

2. The device according to claim 1, wherein at least one of said homogenizing device or said lens array is configured to cause one of the partial beams or one of the groups of partial beams to pass through each respective one of said lenses.

3. The device according to claim 1, wherein all of said lenses in said lens array have the same focal length.

4. The device according to claim 1, wherein all of said lenses in said lens array have at least one of the same width or the same pitch.

5. The device according to claim 1, wherein the following condition holds true for the laser radiation and for said lenses in said lens array:

$$\frac{w_0}{d} > 1.1$$

wherein $w_0$ is a distance in the work plane between a maximum intensity and an intensity that has dropped to $1/e^2$ in the intensity distribution generated by one of said lenses, and wherein d is a distance in the work plane between the maximum intensities of the intensity distributions generated by an adjacent two of said lenses.

6. A laser device, comprising:
   at least one laser light source; and
   a device according to claim 1 for producing laser radiation.

7. The laser device according to claim 6, which further comprises:
   at least one power supply for said at least one laser light source; and
   a control device for actuating said at least one power supply to modify the intensities of the partial beams or groups of partial beams emanating from said homogenizing device.

8. The laser device according to claim 7, wherein said control device matches the intensities of the partial beams or groups of partial beams emanating from said homogenizing device to one another.

9. A device for producing laser radiation, the device comprising:
   a homogenizing device configured to separately homogenize a plurality of partial beams or a plurality of groups of partial beams of the laser radiation and to cause the partial beams or groups of partial beams emanating from said homogenizing device to each generate a line-shaped intensity distribution with steeply decreasing flanks at line ends, in a work plane;
   a superposition device configured to superpose the partial beams or groups of partial beams to permit the line-shaped intensity distribution to be generated in the work plane with a length of the intensity distribution being greater than a length of each line-shaped intensity distribution of the partial beams or groups of partial beams; and
   a control device configured to influence the laser radiation to cause a magnitude of the intensity of all of the partial beams emanating from said homogenizing device or of all of the groups of partial beams emanating from said homogenizing device to be the same;
   said superposition device including a lens array with a plurality of lenses and the following condition holds true for said lenses in said lens array:

$$2 \cdot F \cdot NA(50\%) = M \cdot P_2 \text{ with } M = 1, 2, 3, \ldots,$$

F is the focal length of each lens,
$P_2$ is the pitch of said lenses, and
NA(50%) is the numerical aperture of each lens, defined by an angle at which the intensity of light passing through said lenses has fallen by half.

10. The device according to claim 9, wherein at least one of said homogenizing device or said lens array is configured to cause one of the partial beams or one of the groups of partial beams to pass through each respective one of said lenses.

11. The device according to claim 9, wherein all of said lenses in said lens array have the same focal length.

12. The device according to claim 9, wherein all of said lenses in said lens array have at least one of the same width or the same pitch.

13. The device according to claim 9, wherein the following condition holds true for the laser radiation and for said lenses in said lens array:

$$\frac{w_0}{d} > 1.1$$

wherein $w_0$ is a distance in the work plane between a maximum intensity and an intensity that has dropped to $1/e^2$ in the intensity distribution generated by one of said lenses, and
wherein d is a distance in the work plane between the maximum intensities of the intensity distributions generated by an adjacent two of said lenses.

14. The device according to claim 9, wherein said control device includes a sensor device for detecting the intensity of each partial beam or group of partial beams emanating from said homogenizing device.

15. The device according to claim 14, wherein said sensor device is selected from the group consisting of a photodiode, a photoresistor, a phototransistor or a photocell.

16. The device according to claim 9, wherein said control device includes a comparison device configured to compare the intensities of the partial beams or groups of partial beams emanating from said homogenizing device.

* * * * *